(12) United States Patent
Wadhwa et al.

(10) Patent No.: US 8,350,631 B1
(45) Date of Patent: Jan. 8, 2013

(54) RELAXATION OSCILLATOR WITH LOW POWER CONSUMPTION

(75) Inventors: Sanjay K. Wadhwa, Noida (IN); Deependra K. Jain, Jabalpur (IN)

(73) Assignee: Freescale Semiconductor, Inc, Austin, TX (US)

( * ) Notice: Subject to any disclaimer, the term of this patent is extended or adjusted under 35 U.S.C. 154(b) by 0 days.

(21) Appl. No.: 13/159,440

(22) Filed: Jun. 14, 2011

(51) Int. Cl.
*H03K 3/02* (2006.01)

(52) U.S. Cl. .................................... 331/111; 331/143

(58) Field of Classification Search .................. 331/111, 331/143
See application file for complete search history.

(56) References Cited

U.S. PATENT DOCUMENTS

| 5,670,915 | A  | * | 9/1997  | Cooper et al. ............... 331/111 |
| 6,680,656 | B2 | * | 1/2004  | Chen ............................. 331/143 |
| 7,109,804 | B2 |   | 9/2006  | Mader |
| 7,443,254 | B2 |   | 10/2008 | Gong |
| 7,733,191 | B2 |   | 6/2010  | Olmos |
| 2005/0073370 | A1 | * | 4/2005 | Mitsuda ....................... 331/36 C |
| 2012/0126906 | A1 | * | 5/2012 | Choe et al. ................... 331/143 |

* cited by examiner

*Primary Examiner* — Joseph Chang
(74) *Attorney, Agent, or Firm* — Charles Bergere (57) ABSTRACT

A relaxation oscillator for generating oscillator signal includes a ramp voltage generating circuit, a reference voltage generating circuit, a reference voltage switching circuit, and a digital logic circuit. The reference voltage generating circuit generates one or more reference voltages and the ramp voltage generating circuit generates one or more ramp voltages. The ramp voltages are compared with each of the reference voltages by sequentially switching the reference voltages using a reference voltage switching signal generated by the reference voltage switching circuit. The oscillator signal is generated by the digital logic circuit based on the results of the comparisons.

17 Claims, 7 Drawing Sheets

RELAXATION OSCILLATOR WITH LOW POWER CONSUMPTION

BACKGROUND OF THE INVENTION

The present invention relates to relaxation oscillators, and, more particularly, to relaxation oscillators with low power consumption.

Relaxation oscillators are widely used in modern electronic systems such as radio, telecommunications, computers, and other electronic systems for the generation of oscillator signals. Oscillator signals are required to meet timing critical requirements such as modulation and demodulation of message signals in communication systems, synchronous operation of electronic circuits, and so forth. A relaxation oscillator includes a resistor-capacitor (RC) circuit. An oscillator signal is generated by charging and discharging the capacitor through the RC circuit. The frequency of the oscillator signal is varied by varying the time constant of the RC circuit. For example, to increase the frequency of the oscillator signal, the value of the resistor can be reduced. However, this results in higher power consumption.

Figure 1A:
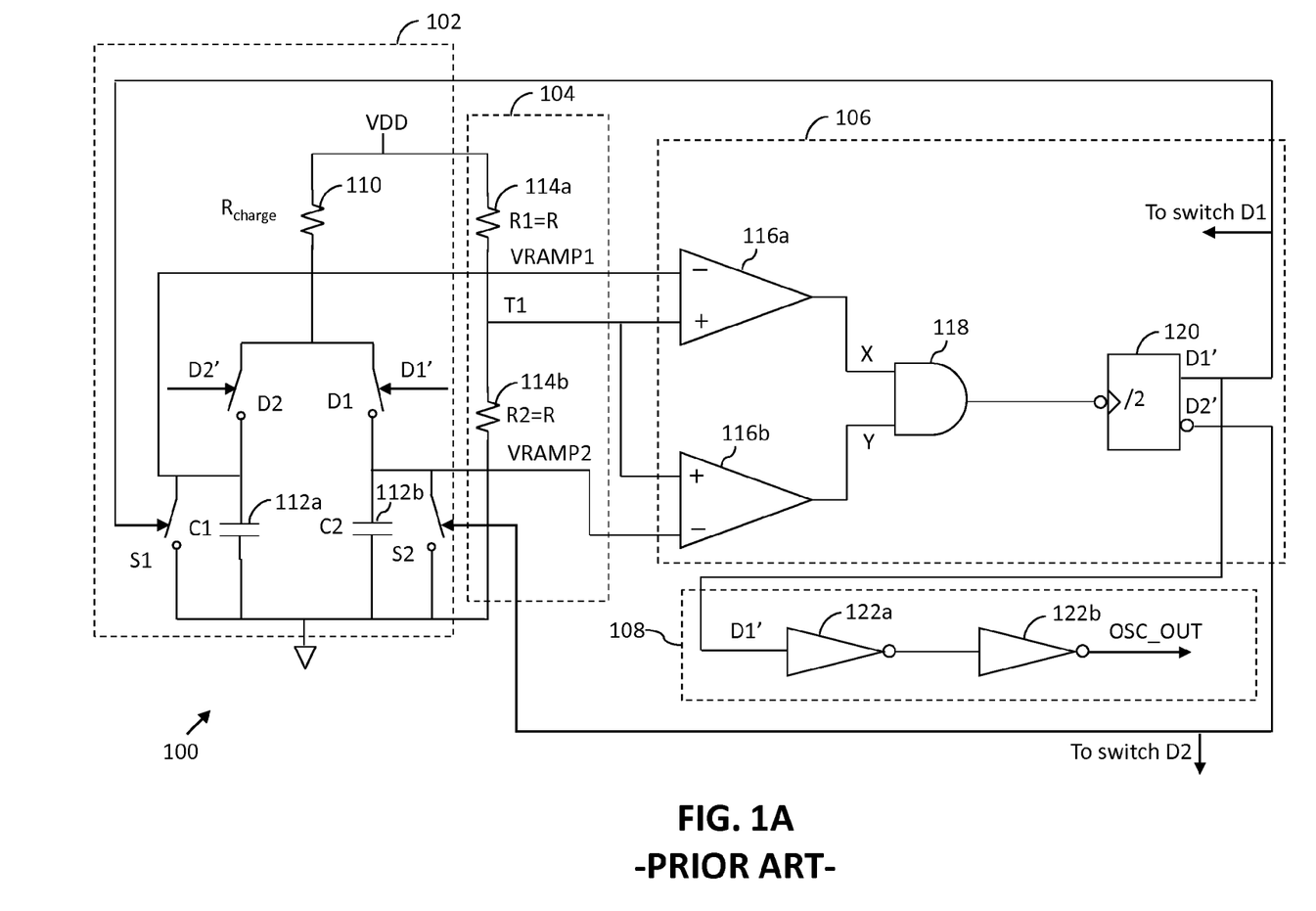
FIG. 1A is a schematic diagram of a conventional relaxation oscillator.

Referring to FIG. 1A, a schematic diagram illustrating a conventional relaxation oscillator 100 is shown. The conventional relaxation oscillator 100 includes a ramp voltage generating circuit 102, a reference voltage generating circuit 104, a switching signal generating circuit 106, and an oscillator signal generating circuit 108. The ramp voltage generating circuit 102 includes a charging resistor 110 ($R_{charge}$) and capacitors 112a and 112b ($C_1$ and $C_2$ respectively). The reference voltage generating circuit 104 includes resistors 114a and 114b ($R_1$ and $R_2$ respectively). The switching signal generating circuit 106 includes comparators 116a and 116b, an AND gate 118, and a divide-by-2 counter 120. The oscillator signal generating circuit 108 includes NOT gates 122a and 122b.

The charging resistor 110 is connected to a voltage source VDD. The capacitor 112a is connected between the charging resistor 110 and ground. More particularly, one terminal of the capacitor 112a is connected to the charging resistor 110 through a switch D2 and the other terminal is connected to ground. A switch S1 is connected in parallel with the capacitor 112a. Charging of the capacitor 112a is initiated by closing switch D2 and keeping switch S1 open. The capacitor 112a is discharged by closing switch S1 and opening switch D2. The capacitor 112b is connected between the charging resistor 110 and ground in a configuration similar to that of the capacitor 112a with switches D1 and S2, which are used to charge and discharge the capacitor 112b.

The capacitors 112a and 112b also are connected to the negative terminals of the comparators 116a and 116b, respectively. The positive terminals of the comparators 116a and 116b are connected to the reference voltage generating circuit 104 at a voltage tap T1. The resistors 114a and 114b of the voltage generating circuit 104 are connected in series between the voltage source VDD and ground with the voltage tap T1 being located at a node between the resistors 114a, 114b.

The output terminals of the comparators 116a and 116b are connected to the input terminals of the AND gate 118. The output of the AND gate 118 is connected to the divide-by-2 counter 120. The outputs of the divide-by-2 counter 120 are ramp voltage switching signals D1' and D2', which are provided to the ramp voltage generating circuit 102 to control switches S1, D1 and S2, D2 respectively. The ramp voltage switching signal D2' is the complement of the ramp voltage switching signal D1'.

Figure 1B:
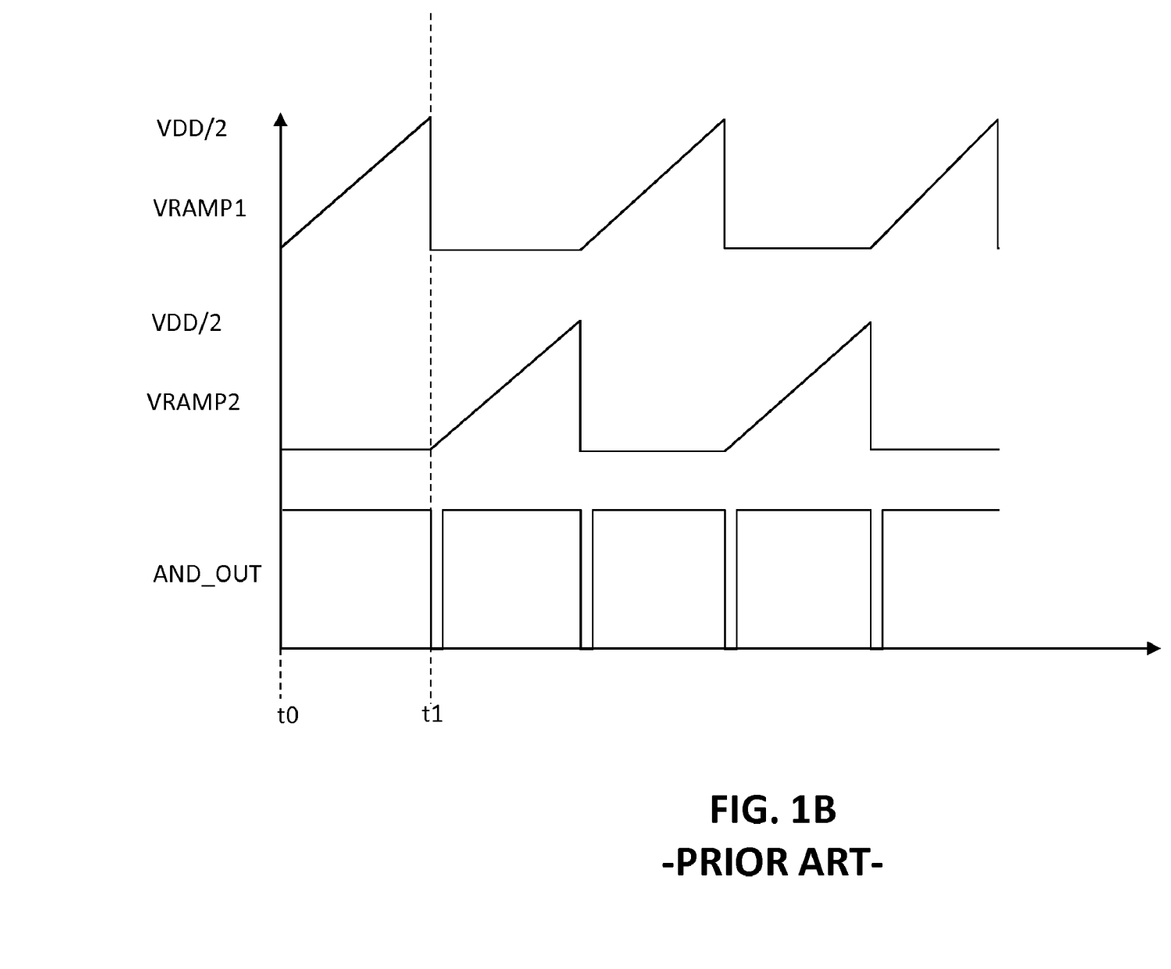
FIG. 1B is a timing diagram illustrating waveforms VRAMP1, VRAMP2, and AND_OUT of the conventional relaxation oscillator of FIG. 1A.

Referring now to FIG. 1B, a timing diagram illustrating waveforms of voltages VRAMP1, VRAMP2, and AND_OUT signal of the conventional relaxation oscillator 100 are shown. The operation of the relaxation oscillator 100 will now be explained with reference to FIG. 1B. At time t0 with switch D2 closed and switch S1 open, charging of the capacitor 112a through the charging resistor 110 is initiated. Further, switch D1 is open and switch S2 is closed. As a result, the capacitor 112b is at ground potential.

The charging of the capacitor 112a causes the voltage at the negative terminal (VRAMP1) of the comparator 116a to begin to increase. Since, the capacitor 112b is at ground potential, the voltage at the negative terminal of the comparator 116b (VRAMP2) remains at ground potential while the voltage VRAMP1 increases. The positive terminals of the comparators 116a and 116b receive a constant voltage generated by the reference voltage generating circuit 104 through the voltage tap T1. The reference voltage generating circuit 104 generates a constant voltage using a resistance ladder made up of the resistors 114a and 114b. In a scenario when the resistors 114a and 114b are identical and a first end of the resistors ladder is connected to the voltage source VDD, that delivers a constant voltage VDD, and a second end connected to ground, then the voltage obtained at the voltage tap T1 is VDD/2. This constant voltage is provided to the positive terminals of the comparators 116a and 116b.

The comparators 116a and 116b compare the voltages VRAMP1 and VRAMP2, respectively, with the voltage VDD/2 to generate output signals X and Y, respectively. At the beginning of the circuit operation VRAMP1 and VRAMP2 are less than VDD/2; therefore output signals X and Y are high. As a result, the output of the AND gate 118, AND_OUT signal, is also high. The complement of the AND_OUT signal is provided as an input clock signal to the divide-by-2 counter 120. The divide-by-2 counter 120 toggles the states of the output signals, (the ramp voltage switching signals D1' and D2'), when the input clock signal switches to a low state. Thus, the states of the outputs are stable when VRAMP1 and VRAMP2 are less than VDD/2. As a result, the OSC_OUT signal generated by the oscillator signal generating circuit 108 is also high.

Subsequently, at time t1, VRAMP1 becomes equal to VDD/2 so the output signal X goes low, which in turn causes the AND_OUT signal to go low. This results in the ramp voltage switching signals D1' and D2' toggling their respective states. Thus, the ramp voltage switching signal D1' switches to a high state and the ramp voltage switching signal D2' switches to a low state. As a result, switches S2 and D2 are opened and switches S1 and D1 are closed. This results in discharging of the capacitor 112a and initiation of charging of the capacitor 112b. As a result, VRAMP1 switches to ground potential and VRAMP2 begins to increase. The output signal X of the comparator 116a momentarily goes low (when VRAMP1 becomes greater than VDD/2), however subsequent to VRAMP1 switching to ground potential, the output signal X goes high. Additionally, since VRAMP2 is less than VDD/2 when the capacitor 112b starts charging, the output signal Y of the comparator 116b is also high. Thus, the AND_OUT signal momentarily goes low, and subsequently switches back to high. As mentioned earlier, the ramp voltage switching signal D1' changes state when the AND_OUT signal goes low, thus a pulse is obtained in the OSC_OUT signal every time the AND_OUT signal goes low. The above-described sequence of charging and discharging of the capacitors 112a and 112b is repeated resulting in generation of the OSC_OUT signal.

The above system for generation of the OSC_OUT signal involves continual charging and discharging of the RC circuits including $R_{charge}$ and $C_1$ and $R_{charge}$ and $C_2$. Thus, the frequency of the OSC_OUT signal is controlled by the time required to charge the capacitors 112a and 112b or the time constant of the RC circuit. To increase the frequency of the OSC_OUT signal, the time required for charging the capacitors 112a and 112b must be decreased. To achieve a reduction in the charging time of the capacitors, the charge current used to charge the capacitors must be increased. Thus, the higher the frequency of the OSC_OUT signal, the greater the current consumption. Since, current consumption and frequency are related, a decrease in current consumption translates into a decrease in the frequency of the OSC_OUT signal. It would be advantageous to have a relaxation oscillator that allows for an increase in the frequency of the OSC_OUT signal without increasing current consumption, and thus providing high frequency oscillator signals at low power.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a system for generating an oscillator signal is provided. The system includes a ramp voltage generating circuit for generating a ramp voltage based on a ramp voltage switching signal, a reference voltage generating circuit, coupled to a voltage source, for generating at least one reference voltage and a reference voltage switching circuit, coupled to the ramp voltage generating circuit. The reference voltage switching circuit includes a comparator having a first input terminal that receives the ramp voltage and a second input terminal that receives the at least one reference voltage. Further, the reference voltage switching circuit includes a digital logic circuit, connected to the output terminal of the comparator, for generating a reference voltage switching signal, the ramp voltage switching signal, and the oscillator signal. The reference voltage switching circuit further includes a reference voltage switch, coupled between the reference voltage generating circuit and the second input terminal of the comparator, for providing the at least one reference voltage to the second input terminal of the comparator based on the reference voltage switching signal. The reference voltage switching signal, the oscillator signal, and the ramp voltage switching signal toggle based on a predetermined relationship between the ramp voltage and the at least one reference voltage.

In another embodiment of the present invention, a relaxation oscillator for generating an oscillator signal is provided. The relaxation oscillator includes a ramp voltage generating circuit for generating first and second ramp voltages based on a ramp voltage switching signal and a reference voltage generating circuit for generating first and second reference voltages. Further, the relaxation oscillator includes a reference voltage switching circuit, coupled to the ramp voltage generating circuit and the reference voltage generating circuit. The reference voltage switching circuit includes a first comparator having a negative input terminal that receives the first ramp voltage and a positive input terminal that receives the first reference voltage. The reference voltage switching circuit further includes a second comparator having a negative input terminal that receives the second ramp voltage and a positive input terminal that receives the second reference voltage. The reference voltage switching circuit further includes a digital logic circuit, connected to the output terminals of the first and the second comparators, for generating a reference voltage switching signal, the ramp voltage switching signal, and the oscillator signal. Additionally, the reference voltage switching circuit includes first and second reference voltage switches that are coupled between the reference voltage generating circuit and the first and the second comparators, respectively. The first and second reference voltage switches provide the first and second reference voltages to the positive terminals of the first and the second comparators, based on the reference voltage switching signal.

In yet another embodiment of the present invention, a relaxation oscillator for generating an oscillator signal is provided. The relaxation oscillator includes a ramp voltage generating circuit for generating first and second ramp voltages. The ramp voltage generating circuit includes first and second capacitors connected to ground by way of respective first and second ramp voltage switches. The ramp voltage generating circuit further includes a current source connected, by way of a third ramp voltage switch to the first comparator and by way of a fourth ramp voltage switch to the second comparator, in which the first, second, third, and fourth ramp voltage switches toggle based on a ramp voltage switching signal.

The relaxation oscillator further includes a reference voltage generating circuit, coupled to a voltage source, for generating a reference voltage. The reference voltage generating circuit includes a resistor-ladder network, in which the reference voltage is obtained from one or more voltage taps of the resistor-ladder network. Further, the relaxation oscillator includes a reference voltage switching circuit, coupled to the reference voltage generating circuit, which includes a first comparator and a second comparator. The negative terminal of the first comparator receives the first ramp voltage and the positive terminal of the first comparator receives a first reference voltage. The negative terminal of the second comparator receives the second ramp voltage and the positive terminal of the second comparator receives a second reference voltage. The reference voltage switching circuit further includes a digital logic circuit, connected to the output terminals of the first and the second comparators, for generating a reference voltage switching signal, the ramp voltage switching signal, and the oscillator signal. Additionally, the reference voltage switching circuit includes first and second reference voltage switches, coupled between the reference voltage generating circuit and the positive terminals of the first and the second comparators. The first reference voltage switch provides the first reference voltage of one or more reference voltages to the first comparator. Further, the second reference voltage switch provides the second reference voltage of the one or more reference voltages to the second comparator.

Various embodiments of the present invention provide a relaxation oscillator comprising a reference voltage generating circuit, a ramp voltage generating circuit, a reference voltage switching circuit, and a digital circuit. The ramp voltage generating circuit generates at least one ramp voltage which is compared with one of the reference voltages generated by the reference voltage generating circuit. At the beginning, the ramp voltage is compared with the lowest reference voltage generated by the reference voltage generating circuit. When the ramp voltage becomes equal to the lowest reference voltage, the reference voltage is switched to a value which is higher than the previous reference voltage. Due to the multiple reference voltages used for comparison, multiple pulses may be obtained at the several time instants when the ramp voltage becomes equal to the reference voltage. The pulses so obtained are converted into the oscillator signal using the digital circuit. The frequency of the oscillator signal depends upon the number of pulses that may be obtained without discharging the capacitor. The frequency may be increased without a corresponding decrease in the charging resistance of the capacitor or an increase in the charging current drawn by the capacitor. To increase the frequency of oscillation, the reference voltage generating circuit is altered, by adding another tap in the resistance-ladder network, to generate multiple reference voltages without increasing the actual value of the resistance. Thus, the frequency of oscillation doubles with the generation of every additional reference voltage. For example, in a scenario when one reference voltage VDD/2 is generated, generation of additional reference voltage VDD/4, i.e., half of VDD/2, results in doubling of the frequency of oscillation. Further, when another reference voltage VDD/8, i.e., half of VDD/4 is generated, the frequency of oscillation is quadrupled. In other words, the power consumption is halved for a given frequency with the addition of a reference voltage as described above. Thus, the frequency of oscillation of the relaxation oscillator of the present invention may be increased without increasing the power consumption.

Figure 2A:
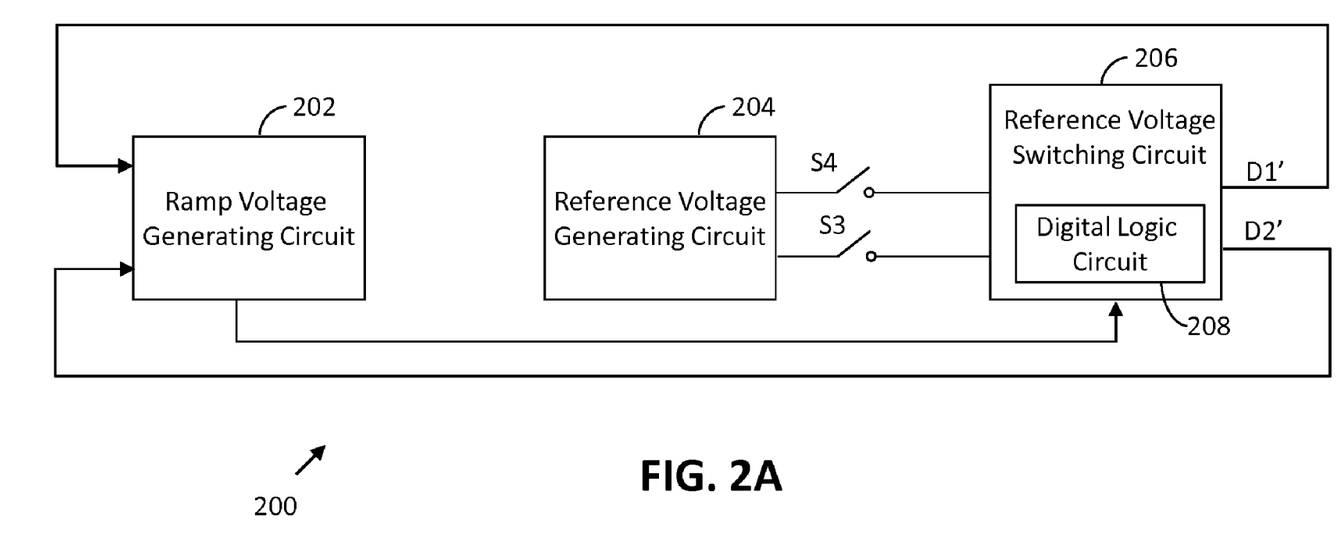
FIG. 2A is a schematic diagram of a relaxation oscillator in accordance with an embodiment of the present invention.

Referring now to FIG. 2A, a schematic diagram of a relaxation oscillator 200 in accordance with an embodiment of the present invention is shown. The relaxation oscillator 200 includes a ramp voltage generating circuit 202, a reference voltage generating circuit 204, and a reference voltage switching circuit 206. The reference voltage switching circuit 206 includes a digital logic circuit 208. The ramp voltage generating circuit 202 generates one or more ramp voltages. The reference voltage generating circuit 204 generates one or more reference voltages. The reference voltage switching circuit 206 is coupled to the reference voltage generating circuit 204 through switches S3 and S4 and generates ramp voltage switching signals D1' and D2'. The ramp voltage switching signals D1' and D2' are provided to the ramp voltage generating circuit 202 for generating the one or more ramp voltages. The digital logic circuit 208 generates reference voltage switching signal S3' and S4' (not shown) for switching the reference voltage provided to the reference voltage switching circuit 206.

Figure 2B:
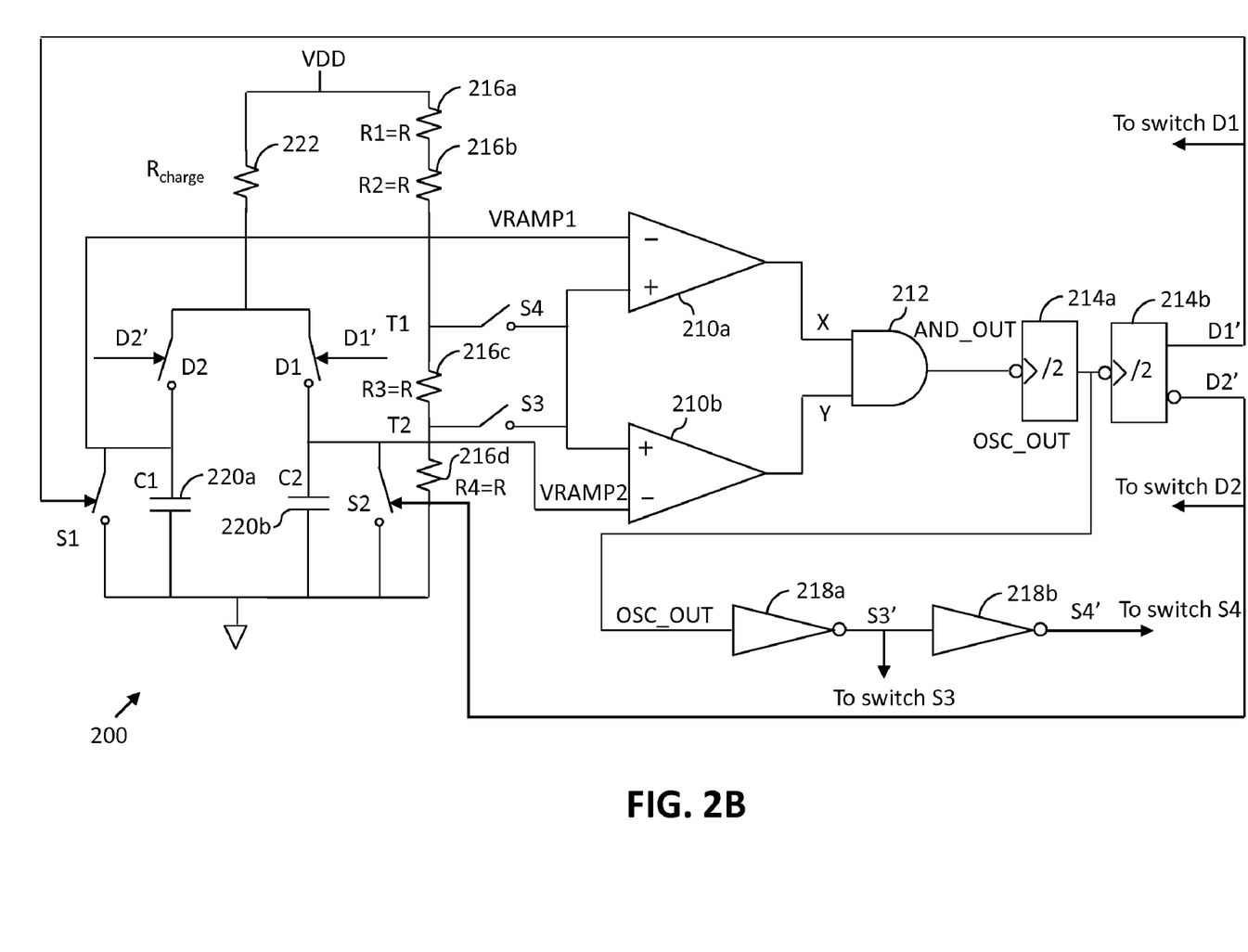
FIG. 2B is a detailed schematic diagram of the relaxation oscillator illustrated in FIG. 2A in accordance with an embodiment of the present invention.

Referring now to FIG. 2B, a detailed schematic diagram of the relaxation oscillator 200 illustrated in FIG. 2A in accordance with an embodiment of the present invention is shown. The relaxation oscillator 200 includes comparators 210a and 210b, an AND gate 212, divide-by-2 counters 214a and 214b, resistors 216a, 216b, 216c, and 216d ($R_1$, $R_2$, $R_3$, and $R_4$ respectively), NOT gates 218a and 218b, capacitors 220a and 220b ($C_1$ and $C_2$), and a charging resistor 222 ($R_{charge}$).

The ramp voltage generating circuit 202 includes the capacitors 220a and 220b, the charging resistor 222, and switches S1, S2, D1, and D2. The capacitor 220a is connected between the charging resistor 222 and ground. One terminal of the capacitor 220a is connected to the charging resistor 222 through a switch D2 and the other terminal is connected to the ground with a switch S1 in parallel. Further, the capacitor 220b is connected between the charging resistor 222 and ground in a configuration similar to that of the capacitor 220a. The charging resistor 222 is connected between a voltage source VDD and the capacitors 220a and 220b, through switches D2 and D1, respectively. The charging of the capacitor 220a may be initiated by closing the switch D2 and keeping the switch S1 open. The capacitor 220a is discharged by closing switch S1 and opening the switch D2. Switches D1 and S2 are used for charging and discharging the capacitor 220b.

The reference voltage generating circuit 204 includes a resistor-ladder network including resistors 216a, 216b, 216c, and 216d connected in series. The resistor-ladder network may include more than four resistors, however only four resistors have been shown for the sake of simplicity. A first end of the resistor-ladder network is connected to the voltage source VDD and a second end is connected to ground. In an embodiment of the present invention, the resistors 216a, 216b, 216c, and 216d may have identical resistance values, i.e., $R_1=R_2=R_3=R_4=R$. A first terminal of the resistor 216b is connected to the resistor 216a. A second terminal of the resistor 216b is connected with a first terminal of the resistor 216c to achieve a voltage tap T1. A first terminal of the resistor 216d is connected to a second terminal of the resistor 216c to provide a voltage tap T2. Additionally, the reference voltage generating circuit 204 is connected to the reference voltage switching circuit 206 at the voltage taps T1 and T2.

The reference voltage switching circuit 206 includes comparators 210a and 210b. The negative terminals of the comparators 210a and 210b are connected to the capacitors 220a and 220b. The positive terminals of the comparators 210a and 210b are connected to each other and to the voltage taps T1 and T2 through switches S4 and S3, respectively. By opening and closing switches S4 and S3, the positive terminals of the comparators 210a, 210b may be connected/disconnected to the voltage tap T1 or T2, respectively. This provides either voltage VDD/2 or VDD/4 as the reference voltage to the comparators 210a and 210b. The resistor-ladder network including resistors 216a, 216b, 216c, and 216d, may be replaced with a band-gap reference voltage generator (not shown) that may be programmed to generate a series of predefined reference voltages (such as VDD/2 and VDD/4). Since band-gap reference voltage generators are well-known in the art, further explanation is not necessary for a complete understanding of the invention.

The output terminals of the comparators 210a and 210b are connected to the digital logic circuit 208. The digital logic circuit 208 includes the AND gate 212 and the divide-by-2 counters 214a and 214b. In an embodiment of the present invention, each of the divide-by-2 counters 214a and 214b includes a D flip-flop with the inverted output signal of the D flip-flop provided as an input signal to the D flip-flop to generate an output signal having a frequency that is half of the input clock signal. The input terminals of the AND gate 212 are connected to the output terminals of the comparators 210a and 210b and the output terminal of the AND gate 212 is connected to the divide-by-2 counter 214a. The output terminal of the divide-by-2 counter 214a is provided as an input clock signal to the divide-by-2 counter 214b. The output signal of the divide-by-2 counter 214a is the oscillator signal (OSC_OUT signal). The outputs of the divide-by-2 counter 214b are ramp voltage switching signals D1' and D2', which are provided to the ramp voltage generating circuit 202 for controlling the operation of switches D1, D2, S1, and S2. The ramp voltage switching signal D2' is the complement of the ramp voltage switching signal D1'. The ramp voltage switching signal D1' is provided to the switches S1 and D1 and the ramp voltage switching signal D2' is provided to the switches S2 and D2. The OSC_OUT signal is complemented by the NOT gate 218a to generate a reference voltage switching signal S3' that is used to control the switch S3. The reference voltage switching signal S3' is complemented by the NOT gate 218b to obtain a reference voltage switching signal S4' that is used to control the switch S4.

Figure 2C:
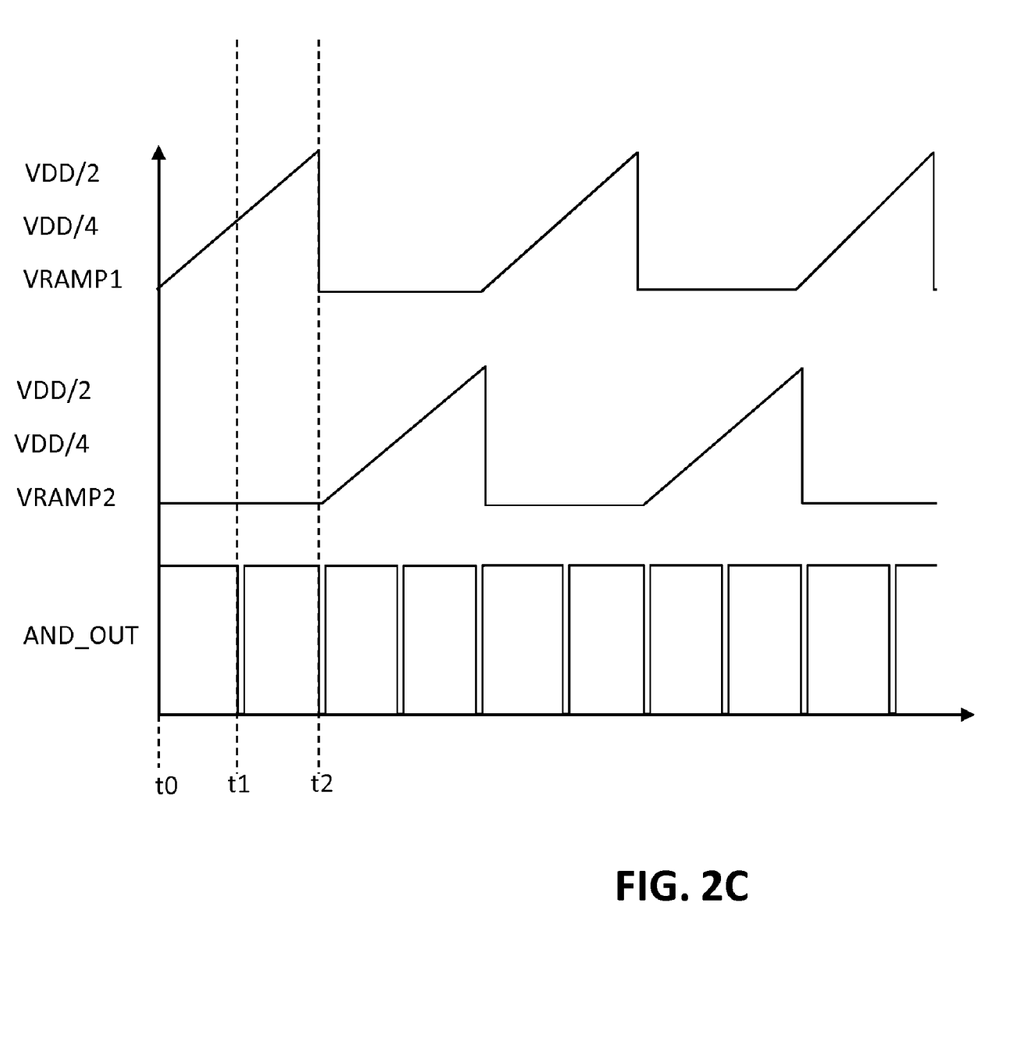
FIG. 2C is a timing diagram illustrating waveforms VRAMP1, VRAMP2, and AND_OUT of the relaxation oscillator illustrated in FIG. 2B.

Referring now to FIG. 2C, a timing diagram illustrating waveforms VRAMP1, VRAMP2, and AND_OUT of the relaxation oscillator 200 illustrated in FIG. 2B in accordance with an embodiment of the present invention is shown. At time t0, the operation of the relaxation oscillator 200 begins with the switch D2 closed (which means that the ramp voltage switching signal D2' is high), and the switch S1 open (which means that the ramp voltage switching signal D1' is low). This initiates charging of the capacitor 220a by the voltage source VDD through the charging resistor 222. Further, the switch D1 is open and the switch S2 is closed. As a result, the capacitor 220b remains at ground potential.

Due to charging of the capacitor 220a, the voltage at the negative terminal of the comparator 210a (VRAMP1) begins to increase. Since, the capacitor 220b is at ground potential, the voltage at the negative terminal of the comparator 210b (VRAMP2) remains at ground potential while the voltage VRAMP1 increases.

The positive terminals of the comparators 210a and 210b receive a reference voltage generated by the reference voltage generating circuit 204. In an embodiment of the present invention, the reference voltage generating circuit 204 generates two different reference voltages, viz., voltages VDD/2 and VDD/4. The voltage VDD/2 is obtained at voltage tap T1 and provided to the positive terminals of the comparators 210a and 210b by closing switch S4 and keeping switch S3 open. The voltage VDD/4 is obtained at voltage tap T2 and provided to the positive terminals of the comparators 210a and 210b by closing switch S3 and keeping switch S4 open. In another embodiment of the present invention, the reference voltage generating circuit 204 generates three different reference voltages, viz., voltages VDD/2, VDD/4, and VDD/8. In such embodiment, an additional switch S5 is added between the reference voltage generating circuit 204 and the comparators 210a and 210b, parallel to the switches S4 and S3.

At the beginning of the circuit operation, the switch S3 is closed (which means that OSC_OUT is low), so voltage tap T2 is connected to the positive terminals of the comparators 210a and 210b, which results in the voltage VDD/4 being provided to the positive terminals of the comparators 210a and 210b. The comparators 210a and 210b compare the voltages VRAMP1 and VRAMP2 respectively with the voltage VDD/4 to generate output signals X and Y, respectively. Since, the voltages VRAMP1 and VRAMP2 are less than the voltage VDD/4; the output signals X and Y are high. As a result, the output of the AND gate 212, AND_OUT signal, is also high. The complement of the AND_OUT signal is provided as an input clock signal to the divide-by-2 counter 214a. The divide-by-2 counter 214a toggles the output signal, i.e., the OSC_OUT signal, when the input clock signal switches to a low state. Thus, the initial state of the OSC_OUT signal is maintained during the time period when the voltages VRAMP1 and VRAMP2 are less than the voltage VDD/4. In an embodiment of the present invention, the OSC_OUT signal is configured to be low at the start of the circuit operation to enable the reference voltage switching signal S3' to be high, and therefore switch S3 is closed. Further, the OSC_OUT signal is provided to the divided-by-2 counter 214b. Similar to the divide-by-2 counter 214a, the divide-by-2 counter 214b also has a property of toggling the states of the output signals, i.e. the ramp voltage switching signals D1' and D2', when the input clock signal, i.e., the OSC_OUT signal transitions from a high state to a low state. In an embodiment of the present invention, the ramp voltage switching signals D1' and D2' are configured to be in a low state and in a high state, respectively at the beginning of the circuit operation, resulting in the switches D1 and S1 being open and the switches D2 and S2 being closed.

Due to the continuous charging of the capacitor 220a, the voltage VRAMP1 becomes equal to the voltage VDD/4 at time t1. As a result, the output signal X becomes low, which in turn renders the AND_OUT signal low. In an embodiment of the present invention, the output signal X becomes low based on a predetermined relationship between the voltage VRAMP1 and the voltage VDD/4. For example, if the predetermined relationship includes the absolute difference between the voltage VRAMP1 and the voltage VDD/4 becoming equal to a predefined value then the OSC_OUT signal toggles from a low state to a high state, which in turn results in the reference voltage switching signals S4' and S3' toggling. Thus, switch S4 is closed and switch S3 is opened. As a result, the positive terminals of the comparators 210a and 210b are connected to the voltage tap T1, thereby providing the voltage VDD/2. Thus, the output signal X is restored to the high state, which in turn results in the AND_OUT signal being restored to the high state.

Since, the OSC_OUT signal transitions from a low state to a high state, the ramp voltage switching signals D1' and D2' maintain their previous states. As a result, the capacitor 220a continues to be charged and the capacitor 220b remains at ground potential. Thus, the voltage VRAMP1 increases beyond the voltage VDD/4 and the voltage VRAMP2 remains constant at ground potential. At time t2, the voltage VRAMP1 becomes equal to the voltage VDD/2, output signal X switches to a low state, resulting in the AND_OUT signal switching to a low state, which further results in the OSC_OUT signal switching to a low state. In an embodiment of the present invention, the output signal X becomes low based on a predetermined relationship between the voltage VRAMP1 and the voltage VDD/2. In an example, the predetermined relationship includes the absolute difference between the voltage VRAMP1 and the voltage VDD/2 becoming equal to a predefined value. This results in the switching signals D1' and D2' toggling their respective states. Thus, the ramp voltage switching signal D1' switches to a high state and the ramp voltage switching signal D2' switches to a low state. As a result, the switches S1 and D1 are closed and switches S2 and D2 are opened. This results in discharging of the capacitor 220a and initiates the charging of the capacitor 220b through the charging resistor 222. As a result, the voltage VRAMP1 switches to ground potential and the voltage VRAMP2 begins to increase. The output signal X becomes low momentarily (when the voltage VRAMP1 becomes greater than VDD/2); however subsequent to the voltage VRAMP1 switching to ground potential, the output signal X becomes high. Additionally, since the voltage VRAMP2 is less than the voltage VDD/4 at the beginning of charging of the capacitor 220b, the output signal Y of the comparator 220b is also high. Thus, the AND_OUT signal reverts to high state as soon as the capacitor 220a discharges and the capacitor 220b begins to be charged. The capacitor 220b is charged to the voltage VDD/4 and then to the voltage VDD/2, which generates two pulses. The steps followed for the pulse generation are similar to that described above in conjunction with the capacitor 220a. The two pulses obtained in the AND_OUT signal during the time period t0 to t2 translates into twice the frequency of oscillation of the OSC_OUT signal. Thus, the frequency of the OSC_OUT signal is increased without changing the magnitude of the charging current used for charging the capacitors 220a and 220b.

In an embodiment of the present invention, more than two reference voltages, viz. three reference voltages, are provided in a sequence to the comparators 210a and 210b. Examples of three reference voltages may be VDD/8, VDD/4, and VDD/2. To provide the third voltage level to the comparators 210a and 210b, an additional switch S5 may be added in parallel to switches S3 and S4 and between the reference voltage generating circuit 204 and the comparators 210a and 210b. In such a scenario, three pulses are obtained in the AND_OUT signal during the time period t0 to t2 corresponding to the time instants when the voltage VRAMP1 becomes equal to VDD/8, VDD/4, and VDD/2 respectively. This translates into a three times increase in the frequency of oscillation of the OSC_OUT signal. In another embodiment of the present invention, four reference voltages, viz. VDD/16, VDD/8, VDD/4, and VDD/2, are provided to the comparators 210a and 210b. In an embodiment of the present invention, the resistor-ladder may be replaced by a band-gap reference voltage generator. In this case, the band-gap reference voltage generator is programmed to generate the various reference voltages, viz., VDD/8, VDD/4, and VDD/2. The various reference voltages are then provided to the positive terminals of the comparators 210a and 210b. In another embodiment of the present invention, the charging resistor 222 is replaced by a current source as illustrated in FIG. 3 (explained below).

Figure 3:
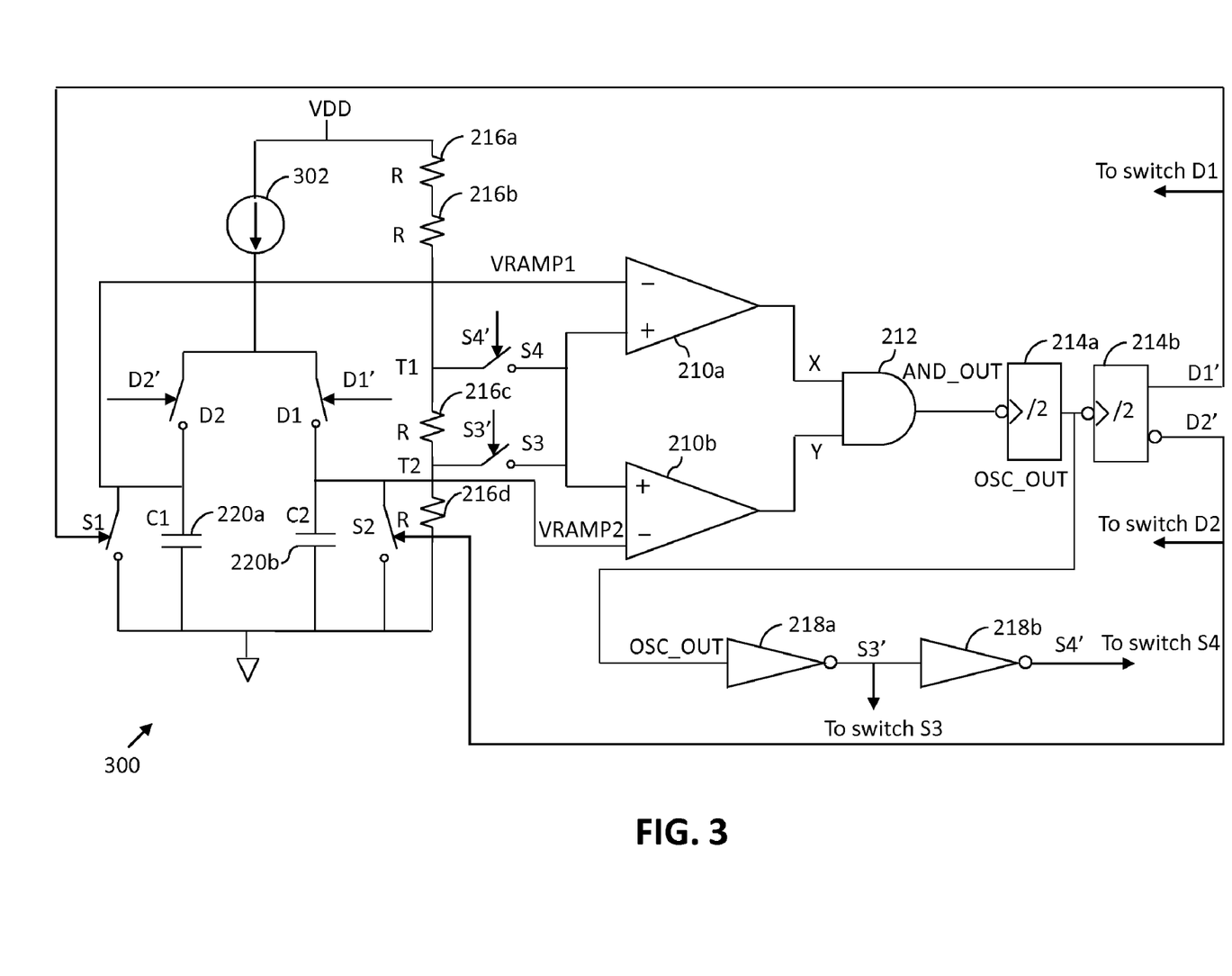
FIG. 3 is a schematic diagram of a relaxation oscillator in accordance with another embodiment of the present invention.

Referring now to FIG. 3, a schematic diagram of a relaxation oscillator 300 in accordance with another embodiment of the present invention is shown. In addition to the elements shown to be a part of the relaxation oscillator 200, the relaxation oscillator 300 includes a current source 302. The charging resistor 222 is replaced by the current source 302. The current source 302 provides a constant current for charging the capacitors 220a and 220b. The operation of the relaxation oscillator 300 is similar to that of the relaxation oscillator 200.

Figure 4:
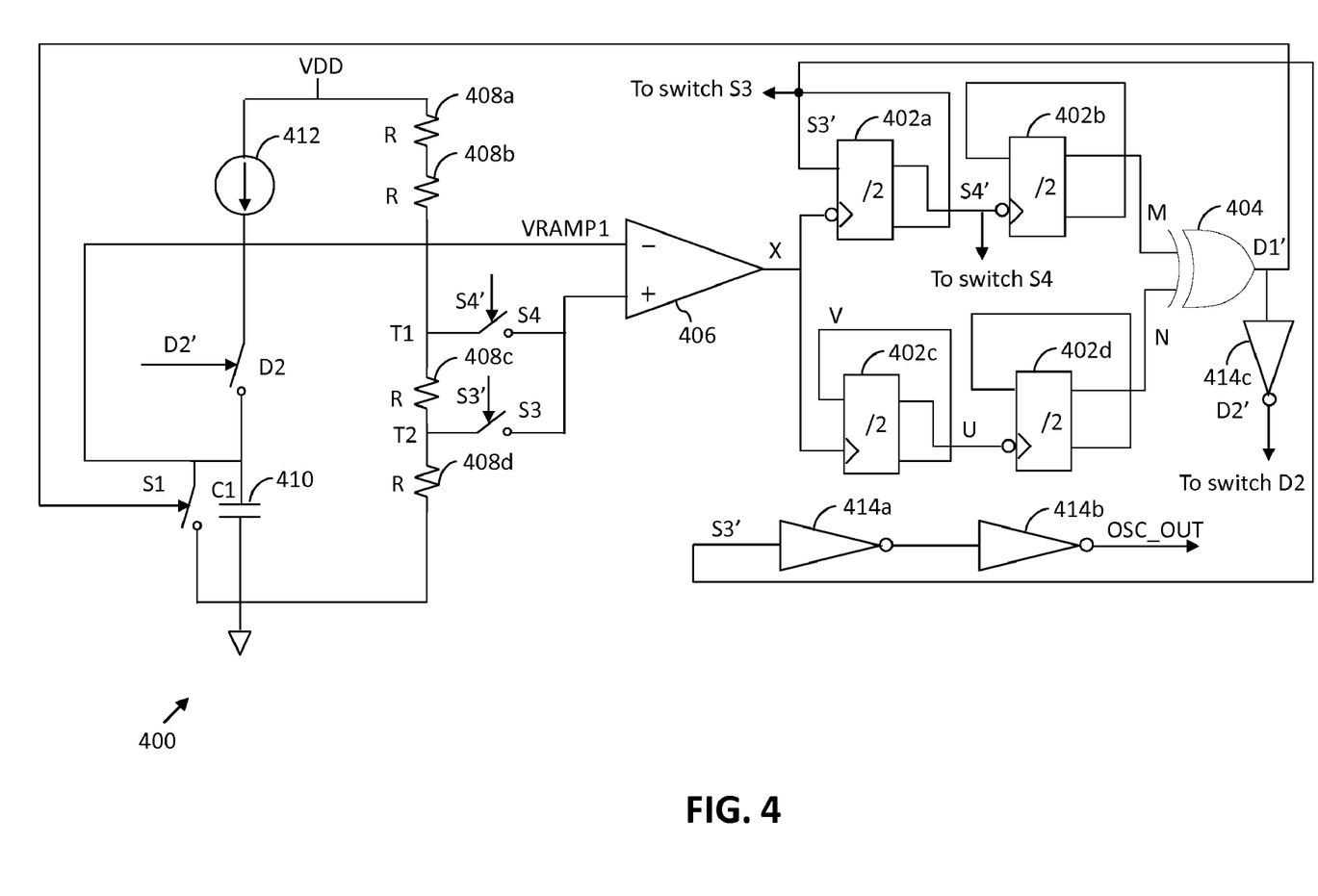
FIG. 4 is a schematic diagram of a relaxation oscillator in accordance with yet another embodiment of the present invention.

Referring now to FIG. 4, a schematic diagram of a relaxation oscillator 400 in accordance with yet another embodiment of the present invention is shown. The relaxation oscillator 400 includes divide-by-2 counters 402a, 402b, 402c, and 402d, a XOR gate 404, a comparator 406, resistors 408a, 408b, 408c, and 408d, a capacitor 410, a current source 412, and NOT gates 414a, 414b, and 414c.

The capacitor 410 is connected between the current source 412 and ground. One terminal of the capacitor 410 is connected to the current source 412 through a switch D2 and the other terminal is connected to the ground with a switch S1 in parallel. The current source 412 is connected to a voltage source VDD. The charging of the capacitor 410 is initiated by closing the switch D2 and keeping the switch S1 open. The capacitor 410 is discharged by closing the switch S1 and opening the switch D2.

Resistors 408a, 408b, 408c, and 408d are connected in series to form a resistor-ladder network. It will be understood by those of skill in the art that the resistor-ladder network may include more than four resistors, however only four resistors have been shown for the sake of simplicity. A first end of the resistor-ladder network is connected to the voltage source VDD and a second end is connected to ground. A first terminal of the resistor 408b is connected to the resistor 408a. A second terminal of the resistor 408b is connected with a first terminal of the resistor 408c to achieve a voltage tap T1. A second terminal of the resistor 408c is connected to a first terminal of the resistor 408d to achieve a voltage tap T2.

The voltage taps T1 and T2 are connected to the positive terminal of the comparator 406 through switches S3 and S4. By opening and closing switches S3 and S4, the positive terminal may be connected to the voltage tap T1 or T2, thereby providing either the voltage VDD/2 or the voltage VDD/4 as a reference voltage to the positive terminal of the comparator 406. The negative terminal of the comparator 406 is connected to a first terminal of the capacitor 410 through the switch D2 and to a second terminal of the capacitor 410 through the switch S1. Thus, the negative terminal is provided the voltage at the first terminal of the capacitor 410 when the switch D2 is ON. In an embodiment of the present invention, the voltage source VDD may be replaced by a band-gap reference voltage generator (not shown). The band-gap reference voltage generates a constant reference voltage VDD which is provided to the resistor-ladder network for generating reference voltages VDD/2 and VDD/4. Since a band-gap reference voltage generator is well-known in the art, a detailed explanation has been excluded from the present description for the sake of brevity.

The output signal X of the comparator 406 is provided to first and second set of divide-by-2 counters. The first set of divide-by-2 counters includes series-connected divide-by-2 counters 402a and 402b in which the divide-by-2 counter 402a generates a reference voltage switching signal S3' for controlling switch S3. The complement of the reference voltage switching signal S3' (S4') is provided as an input clock signal to the divide-by-2 counter 402c. The output terminal of the divide-by-2 counter 402b is provided as an input signal to the XOR gate 404. Additionally, the reference voltage switching signal S3' is buffered using the NOT gates 414a and 414b to generate an oscillator signal, OSC_OUT signal.

The second set of divide-by-2 counters includes the divide-by-2 counters 402c and 402d in which the complement of the output signal generated by the divide-by-2 counter 402c is provided as an input clock signal to the divide-by-2 counter 402d and the output signal of the divide-by-2 counter 402d is provided as an input signal to the XOR gate 404. The XOR gate 404 operates upon the input signals received from the divide-by-2 counters 402b and 402d to generate a ramp voltage switching signal D1' for controlling switch S1. The NOT gate 414c complements the ramp voltage switching signal D1' to generate a ramp voltage switching signal D2' for controlling switch D2.

The operation of the relaxation oscillator 300 will now be explained in detail in conjunction with FIG. 2C. Referring again to FIG. 2C, a timing diagram illustrating waveforms VRAMP1, VRAMP2, and AND_OUT of the relaxation oscillator 200 is shown. Since, the relaxation oscillator 300 includes one capacitor, i.e. the capacitor 410, a single ramp voltage, i.e., the voltage VRAMP1 is obtained during the operation of the relaxation oscillator 300. At time t0, the operation of the relaxation oscillator 300 begins with switch D2 being closed (thus the ramp voltage switching signal D2' is high), and switch S1 open (thus the ramp voltage switching signal D1' is low). This initiates charging of the capacitor 410 by the current source 412.

The charging of the capacitor 410 causes the voltage at the negative terminal (VRAMP1) of the comparator 406 to start increasing. The positive terminal of the comparators 406 receives a reference voltage generated by the resistor-ladder network mentioned above. In an embodiment of the present invention, the resistor-ladder network generates two different reference voltages, voltages VDD/2 and VDD/4, where voltage VDD/2 is obtained at voltage tap T1 and provided to the positive terminal of the comparator 406 by closing switch S4 and keeping switch S3 open. The voltage VDD/4 is obtained at voltage tap T2 and provided to the positive terminal of the comparator 406 by closing switch S3 and keeping switch S4 open. In another embodiment of the present invention, the resistor-ladder network may generate three different reference voltages, viz., voltages VDD/2, VDD/4, and VDD/8. In such a scenario, an additional switch S5 is added between the resistor-ladder network and the comparator 406 in parallel to the switches S3 and S4.

At the beginning of the circuit operation, the switch S3 is closed (OSC_OUT signal is high), therefore the voltage tap T2 is connected to the positive terminal of the comparator 406. This results in voltage VDD/4 being provided to the positive terminal of the comparator 406. The comparator 406 compares the voltage VRAMP1 with the voltage VDD/4 to generate the output signal X. Since, the voltage VRAMP1 is less than the voltage VDD/4; the output signal X is high. The output signal X is provided as an input clock signal to the divide-by-2 counter 402a.

The divide-by-2 counter 402a toggles the states of the output signals, i.e., the reference voltage switching signals S4' and S3' when the input clock signal, i.e., the output signal X switches to a low state. Thus, the initial state of the reference voltage switching signals S4' and S3' is maintained during the time period when the voltage VRAMP1 less than VDD/4. In an embodiment of the present invention, the reference voltage switching signal S3' is configured to be high at the beginning of the operation to enable the voltage tap T2 to be connected to the positive terminal of the comparator 406. This also results in the reference voltage switching signal S4' being configured as low. Further, the OSC_OUT signal (derived by buffering the reference voltage switching signal S3') is also high at the beginning of the operation.

The output signal X is also provided as an input clock signal to the divide-by-2 counter 402c. The divide-by-2 counter 402c toggles the states of the output signals U and V when the input clock signal, i.e., the output signal X, switches to a high state. In an embodiment of the present invention, the initial states of the output signals U and V are low and high, respectively. Complements of the reference voltage switching signal S4' and the output signal U are provided to the divide-by-2 counters 402b and 402d, respectively, as input clock signals. Thus, the divide-by-2 counters 402b and 402d also toggle the states of their respective output signals, i.e., M and N, when the input clock signals, i.e., S4' and U, switch to low state. The output signals M and N are provided to the XOR gate 404 as input signals. The XOR gate 404 generates the ramp voltage switching signal D1' which is low when the input signals, i.e., M and N are identical (either both zero or both one) and which is high when the input signals are different. Since, at the beginning of the circuit operation, the ramp voltage switching signal D1' is required to be low, the input signals M and N are configured to be identical. In an embodiment of the present invention, the initial states of the input signals M and N are configured to be high.

Due to continuous charging of the capacitor 410, the voltage VRAMP1 becomes equal to the voltage VDD/4 at time t1. As a result, the output signal X becomes low, which in turn results in the reference voltage switching signal S4' switching to a high state and the reference voltage switching signal S3' and the OSC_OUT signal switching to a low state. In an embodiment of the present invention, the output signal X goes low based on a predetermined relationship of voltage VRAMP1 with the voltage VDD/4. For example, if the predetermined relationship includes the absolute difference between the voltage between the voltage VRAMP1 and the voltage VDD/4 becoming equal to a predefined value then switch S4 is closed and switch S3 is opened. Thus, the voltage tap T2 is disconnected from the positive terminal of the comparator 406 and the voltage tap T1 is connected to the positive terminal of the comparator 406, which results in voltage VDD/2 being provided to the positive terminal of the comparator 406. Since the reference voltage switching signal S4' switches to a high state, the state of the output signal M is not altered. Additionally, since the output signal X switches to a low state, the states of the output signals U and V also remain constant. This results in the output signal N also maintaining its previous state. Thus, the ramp voltage switching signal D1' does not alter its state, i.e. remains low. This results in the capacitor 410 being charged beyond voltage VDD/4. Therefore, the output signal X switches back to a high state, which results in toggling of the output signal U. Since, the initial state of the output signal U was low, the output signal U switches to a high state. Since, the divide-by-2 counter 402d toggles when the input clock signal switches to a low state, the state of the output signal N remains unaltered.

At time t2, the voltage VRAMP1 becomes equal to the voltage VDD/2. This results in the output signal X switching to a low state, which in turn results in the reference voltage switching signals S3' and S4' toggling their respective states. In an embodiment of the present invention, the output signal X becomes low based on a predetermined relationship between the voltage VRAMP1 and the voltage VDD/2. In an example, the predetermined relationship includes the absolute difference between the voltage VRAMP1 and the voltage VDD/2 becoming equal to a predefined value. Thus, the reference voltage switching signal S4' switches to a low state and the reference voltage switching signal S3' and the OSC_OUT signal switch to a high state. This results in the output signal M transitioning from high to low. Since, the output signal of the divide-by-2 counters 402c and 402d do not toggle, the input signals of the XOR gate 404 become dissimilar. This results in the ramp voltage switching signal D1' transitioning from low to high. This leads to the closing of the switch S1 and opening of the switch D2, thereby causing the capacitor 410 to discharge. Due to discharging, the voltage VRAMP1 is reduced to zero and the output signal X switches to a high state. This results in toggling of the output signal U to a low state. This causes the output signal N also to toggle from a high state to a low state. Since, the input signals (M, N) to the XOR gate 404 become identical, the ramp voltage switching signal D1' toggles to a low state. This causes opening of the switch S1 and closing of the switch D2, thereby initiating the charging cycle of the capacitor 410, which is identical to the charging cycle that began at time t0. This cycle continues and the OSC_OUT signal continues to oscillate between the high and low states.

In an embodiment of the present invention, the first and second sets of divide-by-2 counters may be substituted with a suitable logic circuit that includes other logic components which are capable of generating reference voltage switching signals S3' and S4' and the ramp voltage switching signal D1' identical to the above described signals. In various embodiments of the present invention, a divide-by-2 counter includes a D flip-flop in which the inverted output signal of the D flip-flop is fed as an input signal to the D flip-flop. This results in the output signal having half the frequency of oscillation of the input clock signal. In an embodiment of the present invention, the resistor-ladder network may be replaced by a band-gap reference voltage generator. In this case, the band-gap reference voltage generator is programmed to generate the various reference voltages, viz., VDD/8, VDD/4, and VDD/2. The various reference voltages are then provided to the positive terminal of the comparator 406. In another embodiment of the present invention, the current source 412 may be replaced by a charging resistor as illustrated in FIG. 2B above.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A system for generating an oscillator signal, the system comprising:
    a ramp voltage generating circuit for generating a ramp voltage based on a ramp voltage switching signal;
    a reference voltage generating circuit, coupled to a voltage source, for generating at least one reference voltage; and
    a reference voltage switching circuit, coupled to the ramp voltage generating circuit and the reference voltage generating circuit, wherein the reference voltage switching circuit includes,
        at least one comparator having a first input terminal that receives the ramp voltage and a second input terminal that receives the at least one reference voltage;
        a digital logic circuit, connected to an output terminal of the at least one comparator, for generating a reference voltage switching signal, the ramp voltage switching signal, and the oscillator signal; and
        at least one reference voltage switch, coupled between the reference voltage generating circuit and the second input terminal of the at least one comparator, for providing the at least one reference voltage to the second input terminal of the at least one comparator based on the reference voltage switching signal, wherein the reference voltage switching signal, the oscillator signal, and the ramp voltage switching signal toggle based on a predetermined relationship between the ramp voltage and the at least one reference voltage, and
    wherein the ramp voltage generating circuit comprises:
        at least one capacitor connected to ground by way of a first ramp voltage switch; and
        at least one resistor having a first terminal coupled to the at least one capacitor by way of a second ramp voltage switch, and a second terminal coupled to the voltage source, wherein the first and second ramp voltage switches toggle based on the ramp voltage switching signal.

2. The system of claim 1, wherein the predetermined relationship comprises the ramp voltage being equal to the at least one reference voltage.

3. The system of claim 1, wherein the digital logic circuit comprises first and second sets of divide-by-2 counters, wherein each of the first and second sets of divide-by-2 counters comprises at least two series-connected divide-by-2 counters, and wherein output terminals of the first and second sets of divide-by-2 counters are connected to input terminals of a XOR gate and the XOR gate generates the ramp voltage switching signal.

4. The system of claim 3, wherein the reference voltage switching signal and the oscillator signal are obtained at the output terminal of a first one of the at least two series-connected divide-by-2 counters of the first set of divide-by-2 counters.

5. The system of claim 1, wherein the reference voltage generating circuit comprises a resistor-ladder network coupled to the voltage source.

6. The system of claim 5, wherein the resistor-ladder network includes at least one voltage tap at which the at least one reference voltage is generated.

7. The system of claim 1, wherein the reference voltage generating circuit comprises a bandgap voltage reference circuit for generating the at least one reference voltage.

8. A relaxation oscillator for generating an oscillator signal, the relaxation oscillator comprising:
    a ramp voltage generating circuit for generating first and second ramp voltages based on a ramp voltage switching signal;
    a reference voltage generating circuit for generating at least first and second reference voltages; and
    a reference voltage switching circuit, coupled to the ramp voltage generating circuit and the reference voltage generating circuit, comprising:
        a first comparator having a negative input terminal that receives the first ramp voltage and a positive input terminal that receives the first reference voltage;
        a second comparator having a negative input terminal that receives the second ramp voltage and a positive input terminal that receives the second reference voltage;
        a digital logic circuit, connected to output terminals of the first and the second comparators, for generating a reference voltage switching signal, the ramp voltage switching signal, and the oscillator signal; and
        first and second reference voltage switches coupled between the reference voltage generating circuit and the first and the second comparators, respectively, for providing the first and second reference voltages to the positive terminals of the first and the second comparators, based on the reference voltage switching signal, and
    wherein the digital logic circuit comprises:
        an AND gate connected to the output terminals of the first and the second comparators;
        a first divide-by-2 counter, connected to an output terminal of the AND gate, for generating the oscillator signal; and
        a second divide-by-2 counter, connected in series with the first divide-by-2 counter, for generating the ramp voltage switching signal.

9. The relaxation oscillator of claim 8, wherein the reference voltage switching signal is obtained by complementing the oscillator signal.

10. The relaxation oscillator of claim 8, wherein the reference voltage switching signal, the oscillator signal, and the ramp voltage switching signal toggle when at least one of the first and second ramp voltages becomes equal to the first and the second reference voltages, respectively.

11. The relaxation oscillator of claim 8, wherein the ramp voltage generating circuit comprises:
- a first capacitor connected to ground by way of a first ramp voltage switch;
- a second capacitor connected to ground by way of a second ramp voltage switch; and
- a resistor having a first terminal coupled to the first capacitor by way of a third ramp voltage switch and coupled to the second capacitor by way of a fourth ramp voltage switch, and having a second terminal coupled to a voltage source, wherein the first, second, third, and fourth ramp voltage switches toggle based on the ramp voltage switching signal.

12. The relaxation oscillator of claim 8, wherein the ramp voltage generating circuit comprises:
- first and second capacitors connected to ground by way of respective first and second ramp voltage switches; and
- a current source, respectively connected by way of third and fourth ramp voltage switches to the first and second capacitors, wherein the first, second, third, and fourth ramp voltage switches toggle based on the ramp voltage switching signal.

13. The relaxation oscillator of claim 8, wherein the reference voltage generating circuit comprises a resistor-ladder network coupled to a voltage source.

14. The relaxation oscillator of claim 13, wherein the resistor-ladder network comprises at least first and second voltage taps at which the at least first and second reference voltages are generated.

15. The relaxation oscillator of claim 8, wherein the reference voltage generating circuit comprises a bandgap voltage reference circuit for generating the at least first and second reference voltages.

16. A relaxation oscillator for generating an oscillator signal, the relaxation oscillator comprising:
- a ramp voltage generating circuit for generating a first ramp voltage and a second ramp voltage, the ramp voltage generating circuit including:
  - first and second capacitors connected to ground by way of respective first and second ramp voltage switches; and
  - a current source, connected by way of a third ramp voltage switch to the first capacitor and by way of a fourth ramp voltage switch to the second capacitor, wherein the first, second, third, and fourth ramp voltage switches toggle based on a ramp voltage switching signal;
- a reference voltage generating circuit, coupled to a voltage source, for generating one or more reference voltages, wherein the reference voltage generating circuit comprises a resistor-ladder network and the one or more reference voltages are obtained from one or more voltage taps of the resistor-ladder network; and
- a reference voltage switching circuit, coupled to the reference voltage generating circuit, comprising:
  - a first comparator having a negative terminal that receives the first ramp voltage and a positive terminal that receives a first reference voltage of the one or more reference voltages;
  - a second comparator having a negative terminal that receives the second ramp voltage and a positive terminal that receives a second reference voltage of the one or more reference voltages
  - a digital logic circuit, connected to the output terminals of the first and second comparators, for generating a reference voltage switching signal, the ramp voltage switching signal, and the oscillator signal; and
  - a first reference voltage switch coupled between the reference voltage generating circuit and the positive input terminal of the first comparator for providing the first reference voltage to the first comparator, and a second reference voltage switch coupled between the reference voltage generating circuit and the positive terminal of the second comparator for providing the second reference voltage to the second comparator; and
- wherein the digital logic circuit comprises:
  - an AND gate, connected to the output terminals of the first and second comparators;
  - a first divide-by-2 counter, connected to an output terminal of the AND gate, for generating the oscillator signal; and
  - a second divide-by-2 counter connected in series with the first divide-by-2 counter for generating the ramp voltage switching signal.

17. The relaxation oscillator of claim 16, wherein the reference voltage switching signal, the oscillator signal, and the ramp voltage switching signal toggle when at least one of the first and second ramp voltages becomes equal to the first and second reference voltages provided to the first and second comparators, respectively.

* * * * *